United States Patent
Kishimoto

(10) Patent No.: US 12,122,393 B2
(45) Date of Patent: Oct. 22, 2024

(54) MOTION DETECTION DEVICE

(71) Applicant: HONDA LOCK MFG. CO., LTD., Miyazaki (JP)

(72) Inventor: Keigo Kishimoto, Miyazaki (JP)

(73) Assignee: Honda Lock Mfg. Co., Ltd., Mayazaki (JP)

( * ) Notice: Subject to any disclaimer, the term of this patent is extended or adjusted under 35 U.S.C. 154(b) by 234 days.

(21) Appl. No.: 17/838,540

(22) Filed: Jun. 13, 2022

(65) Prior Publication Data

US 2023/0031005 A1 Feb. 2, 2023

(30) Foreign Application Priority Data

Jul. 30, 2021 (JP) .................................. 2021-125571

(51) Int. Cl.
*B60W 40/09* (2012.01)

(52) U.S. Cl.
CPC ......... *B60W 40/09* (2013.01); *B60W 2420/24* (2013.01); *B60W 2422/10* (2013.01); *B60W 2554/4029* (2020.02); *B60W 2554/4041* (2020.02)

(58) Field of Classification Search
CPC .... E05F 15/73; E05F 15/76; E05Y 2900/548; B60W 2420/24; H03K 17/955
See application file for complete search history.

(56) References Cited

U.S. PATENT DOCUMENTS

| | | | | |
|---|---|---|---|---|
| 9,646,436 | B1* | 5/2017 | Campbell | .......... G07C 9/00309 |
| 2009/0100755 | A1* | 4/2009 | Ishihara | .................. E05F 15/46 |
| | | | | 49/31 |
| 2011/0276234 | A1 | 11/2011 | Van Gastel | |
| 2016/0169708 | A1* | 6/2016 | Sterk | ..................... H03K 17/955 |
| | | | | 324/658 |
| 2020/0223374 | A1* | 7/2020 | Kondo | ................. B60R 11/0264 |
| 2020/0370359 | A1* | 11/2020 | Kuroyanagi | ............ E05F 15/73 |

FOREIGN PATENT DOCUMENTS

| | | |
|---|---|---|
| JP | 2015-021238 A | 2/2015 |
| JP | 2015-148254 A | 8/2015 |
| JP | 2016-047364 A | 4/2016 |
| JP | 2017-066643 A | 4/2017 |
| JP | 2019-127804 A | 8/2019 |
| WO | 2010/076332 A1 | 7/2010 |

OTHER PUBLICATIONS

Office Action with a mailing date of Mar. 5, 2024 issued in the corresponding Japanese Patent Application No. 2021-125571 with the English machine translation thereof.

* cited by examiner

*Primary Examiner* — Mirza F Alam
(74) *Attorney, Agent, or Firm* — Carrier, Shende & Associates P.C.; Joseph P. Carrier; Jeffrey T. Gedeon

(57) ABSTRACT

A motion detection device includes a plurality of sensor electrodes configured to detect static capacitance, and a sensor bracket to which the plurality of sensor electrodes are attached. The sensor bracket is provided with an engagement portion to be engaged with an engaged portion of each of the sensor electrodes. The engagement portion of the sensor bracket and the engaged portion of the sensor electrode are formed in a shape that allows mutual engagement between regular combinations and regulates mutual engagement other than the regular combinations.

5 Claims, 10 Drawing Sheets

FIG. 4

MOTION DETECTION DEVICE

CROSS-REFERENCE TO RELATED APPLICATION

Priority is claimed on Japanese Patent Application No. 2021-125571, filed Jul. 30, 2021, the content of which is incorporated herein by reference.

BACKGROUND OF THE INVENTION

Field of the Invention

The present invention relates to a motion detection device that detects a motion of a person according to a static capacitance type sensor.

Description of Related Art

As a technology of an opening and closing portion such as a tailgate of a vehicle, a technology of detecting a kicking motion of a person to open or close the opening and closing portion is known (for example, refer to PCT International Publication No. WO 2010/76332 and Japanese Unexamined Patent Application, First Publication No. 2015-21238). In this technology, a motion detection device that includes a static capacitance type sensor electrode is used as a sensor for detecting a motion of a person.

In this type of motion detection device, a plurality of sensor electrodes for detecting a change in static capacitance are attached to an attached member on a vehicle body side such as a rear bumper via a sensor bracket. The plurality of sensor electrodes are connected to a control unit for determining the motion of a person such as a kicking motion based on the detected change in static capacitance.

SUMMARY OF THE INVENTION

Conventional motion detection devices have a plurality of sensor electrodes arranged apart from each other in a vertical direction, and distinguishes between a motion of a person and other noise (for example, noise caused by a movement of a small animal, or noise caused by water that has entered the inside of an attached member) based on a change in static capacitance detected from the plurality of sensor electrodes. For this reason, it is important to arrange a plurality of electrodes attached to the sensor bracket in appropriate positions of a sensor bracket and to perform wiring without erroneous assembly.

Aspects according to the present invention have been made in view of the problems described above, and an object of the present invention is to provide a motion detection device capable of assembling a plurality of sensor electrodes in appropriate positions on the sensor bracket without errors.

The present invention has adopted the following configuration to solve the problems described above.

(1) A motion detection device includes a plurality of sensor electrodes configured to detect static capacitance, and a sensor bracket to which the plurality of sensor electrodes are attached, in which the sensor bracket is provided with an engagement portion to be engaged with an engaged portion of each of the sensor electrodes, and the engagement portion of the sensor bracket and the engaged portion of the sensor electrode are formed in a shape that allows mutual engagement between regular combinations and regulates mutual engagement other than the regular combinations.

With the configuration described above, at the time of assembling the sensor electrodes, when the sensor electrodes are assembled in the regular assembling position, the engagement portion of the sensor bracket can be engaged with the engaged portion of each of the sensor electrodes. On the other hand, when the sensor electrodes are assembled in a position other than the regular assembling position, the engagement of the engagement portion of the sensor bracket with the engaged portion of each of the sensor electrodes is regulated. For this reason, a worker who assembles the sensor electrodes can quickly ascertain that the assembling position of the sensor electrodes is inappropriate. Therefore, when the configuration described above is adopted, it is possible to prompt the worker to change the position to the regular assembling position of the sensor electrodes.

(2) In the aspect of (1) described above, the sensor electrode may include a rod-shaped electrode main body, and a protective cap that is adhered to an outer circumferential surface of a part of the electrode main body, the engaged portion may be a notch portion formed in the protective cap, the engagement portion may include a protruding portion accepted by the notch portion.

In this case, a protruding portion is provided in the sensor bracket and a notch portion that allows acceptance of the protruding portion only when the assembling position is appropriate is formed in the protective cap, and thereby it is possible to prevent erroneous assembly of the sensor electrodes. For this reason, it is possible to easily prevent the erroneous assembly of the sensor electrodes without processing the electrode main bodies of the plurality of sensor electrodes.

(3) In the aspect of (2) described above, the sensor bracket may include a holding portion that holds each of the sensor electrodes in a direction intersecting an extending direction of a corresponding sensor electrode, and the protruding portion and the notch portion may be engaged to regulate displacement of the sensor electrode with respect to the sensor bracket in a direction parallel to the extending direction.

In this case, each sensor electrode is held by a holding portion of the sensor bracket and a notch portion of the sensor electrode is caused to be engaged with a corresponding protruding portion of the sensor bracket, and thereby it is possible to assemble the sensor electrode while it is accurately positioned at a regular assembling position, and it is possible to prevent misalignment of the sensor electrode in a direction parallel to the extending direction.

(4) In the aspect of (2) or (3) described above, the protruding portion may have a pair of protruding pieces extending in a substantially tangential direction of an outer circumferential surface of the sensor electrode with the outer circumferential surface therebetween.

In this case, when the sensor electrodes are assembled in the regular assembling position, facing positions of the sensor electrodes on the outer circumference side are sandwiched by a pair of protruding pieces so that each protruding piece is accepted by a corresponding notch portion in that state. For this reason, when the sensor electrodes are assembled in the regular assembling position, each protruding piece is stably accepted by a notch portion, and when the sensor electrodes are assembled in a position other than the regular assembling position, the assembly of the sensor electrodes is regulated by a pair of protruding pieces. Therefore, when this configuration is adopted, it is possible to more reliably prevent the erroneous assembly of the sensor electrodes.

(5) In the aspect of any one of (1) to (4) described above, the engaged portion may be a notch portion formed in the sensor electrode, the engagement portion may have a protruding portion accepted by the notch portion, a plurality of the protruding portions may be arranged to be separated from each other in the extending direction of the sensor electrode, and a separation width of the plurality of protruding portions adjacent to each other in the extending direction may be different for each corresponding sensor electrode.

In this case, since the separation width of the plurality of protruding portions corresponding to the notch portion of each sensor electrode is different for each corresponding sensor electrode, in a position other than the regular assembling position, the plurality of protruding portions cannot be accepted by the plurality of notch portions on the sensor bracket side at the same time. Therefore, when this configuration is adopted, it is possible to reliably prevent the erroneous assembly of the sensor electrodes.

(6) In the aspect of any one of (1) to (5) described above, each of the sensor electrodes may have at least one of a surface color and a surface pattern, and the surface colors and the surface patterns may be different from each other.

In this case, when the sensor electrodes are assembled to the sensor bracket, an assembling worker can find an error in assembling the sensor electrodes by visual confirmation.

In the aspect of the present invention, the engagement portion of the sensor bracket and the engaged portion of the sensor electrode are formed in a shape that allows mutual engagement between regular combinations and regulates mutual engagement between combinations other than regular combinations. For this reason, it is difficult for the assembling worker to assemble the sensor electrodes to the sensor bracket in a position other than the regular assembling position. Therefore, when the aspect according to the present invention is adopted, it is possible to assemble the plurality of sensor electrodes in appropriate positions on the sensor bracket without errors.

BRIEF DESCRIPTION OF THE DRAWINGS

FIG. 4 is a perspective view of the motion detection device of the embodiment from below.

DETAILED DESCRIPTION OF THE INVENTION

Figure 1:
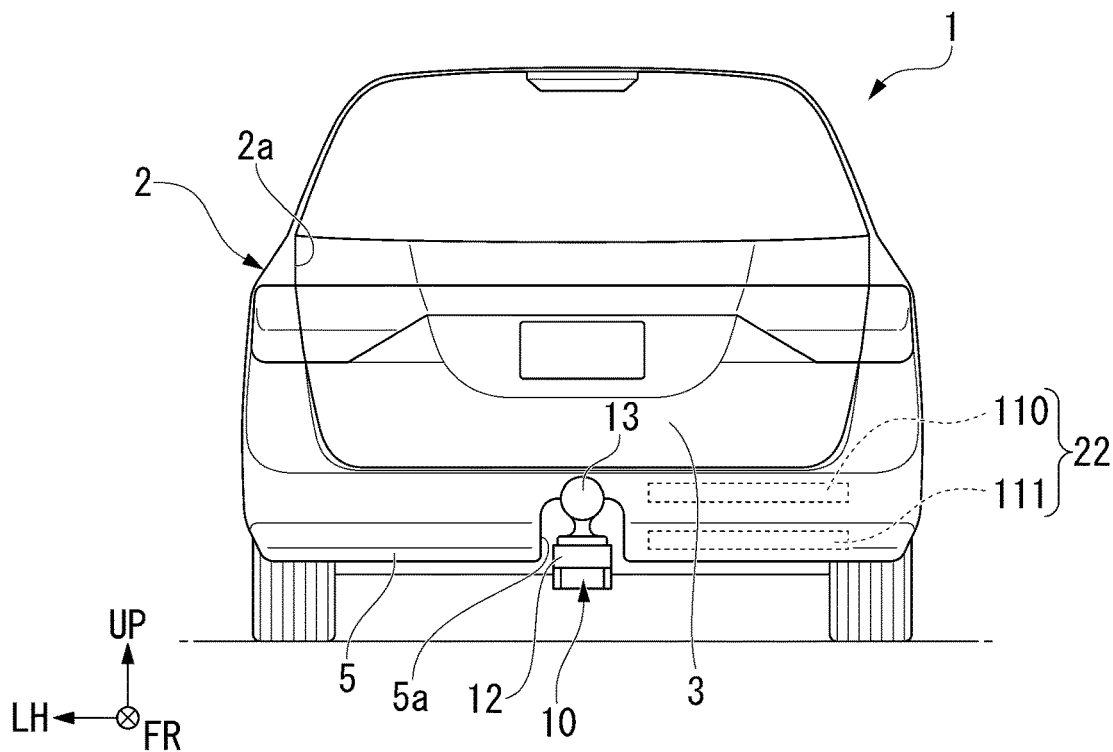
FIG. 1 is a rear view of a vehicle of an embodiment.

Hereinafter, embodiments of the present invention will be described with reference to the drawings. In each embodiment, the same reference numerals will be given to common parts, and duplicated explanations thereof will be omitted.

Figure 2:
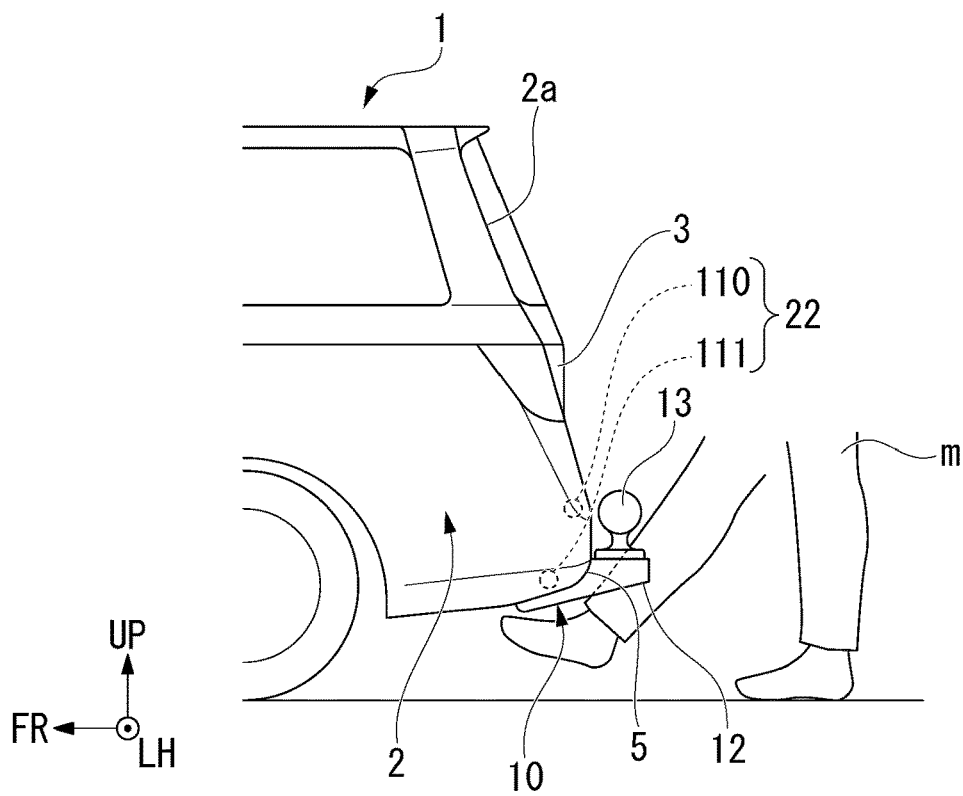
FIG. 2 is a side view of the vehicle of the embodiment.

FIG. 1 is a rear view of a vehicle 1 in which a motion detection device 20 according to an embodiment is employed, and FIG. 2 is a left side view of a rear portion of the vehicle 1. An arrow FR in FIGS. 1 and 2 points forward with respect to the vehicle 1, an arrow UP points upward with respect to the vehicle 1, and an arrow LH points to the left with respect to the vehicle 1.

In FIGS. 1 and 2, reference numeral 2 is a vehicle main body portion of the vehicle 1 having an opening 2a at the rear portion, and reference numeral 3 is a tailgate that is attached to the vehicle main body portion 2 to open or close the opening 2a. Reference numeral 5 is a rear bumper attached to a position below the opening 2a at the rear portion of the vehicle main body portion 2, and reference numeral in is an operator who opens or closes a tailgate 3 with a kicking motion (a motion of bringing toes closer to a specific area near a rear bumper 5).

The vehicle 1 of the present embodiment is a vehicle capable of connecting a towed object such as a trailer or a carrier to the rear portion of the vehicle body. The rear bumper 5 extends in a vehicle width direction. The rear bumper 5 covers a lower portion frame at the rear portion of the vehicle body from the rear at a position below the vehicle main body portion 2. The lower portion frame of the vehicle main body portion 2 includes a hitch member 10 to be described below.

Figure 3:
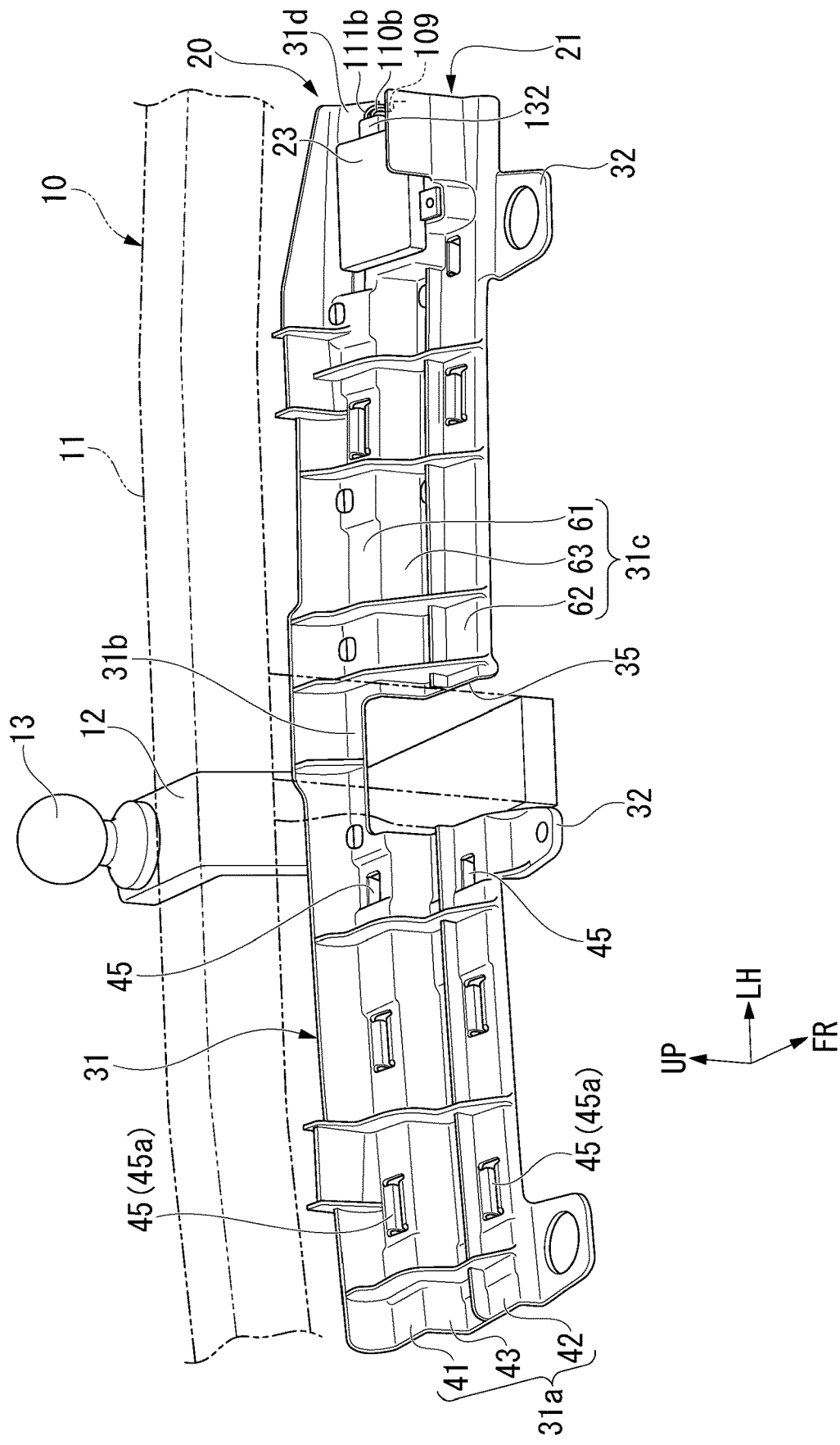
FIG. 3 is a perspective view of a motion detection device and a hitch member of the embodiment from the front.
Figure 4:
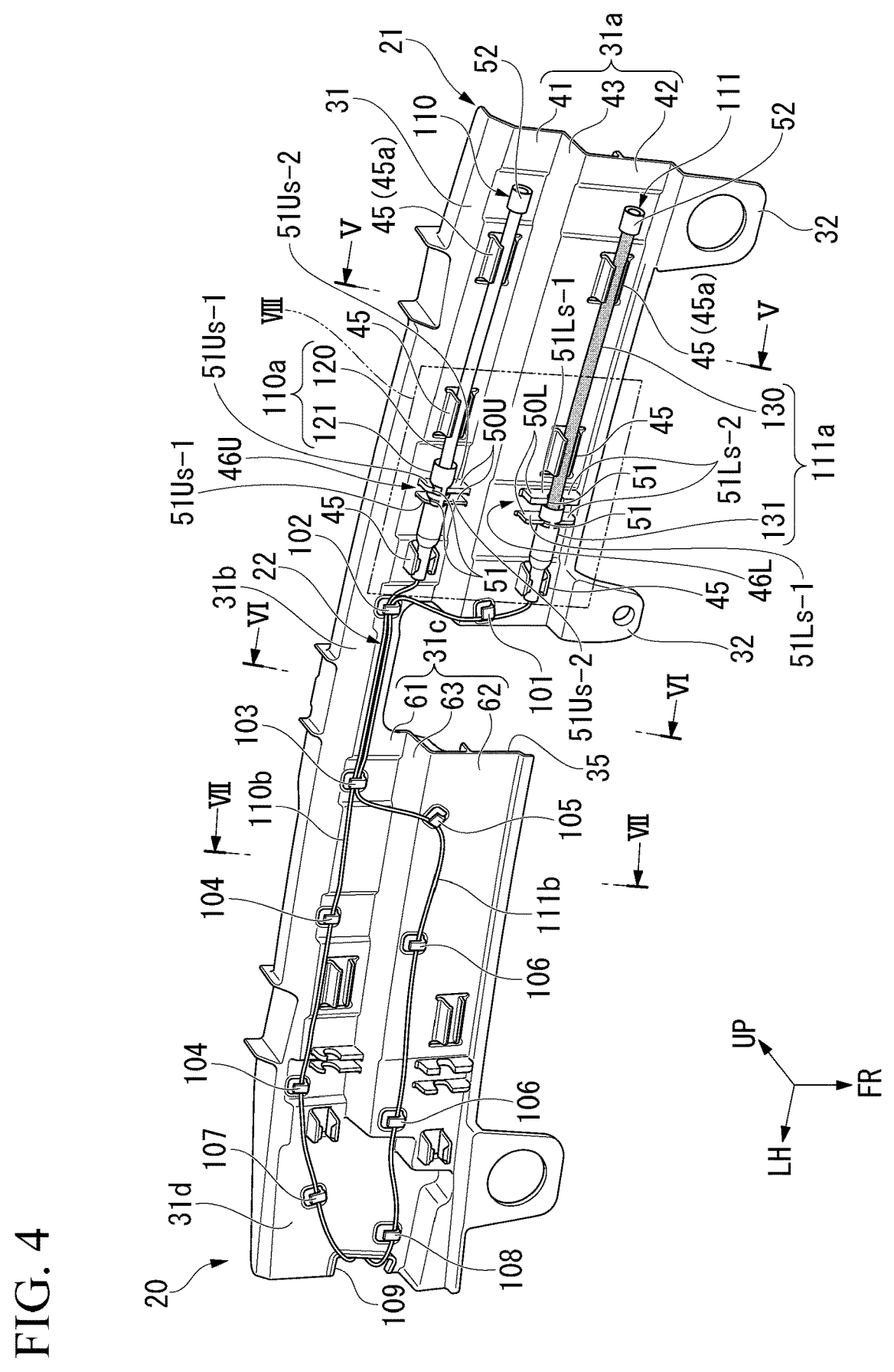

FIG. 3 is a perspective view of the motion detection device 20 and the hitch member 10 from the front. FIG. 4 is a perspective view of the motion detection device 20 from below.

As shown in FIG. 3, the hitch member 10 includes a rear back beam 11 that connects rear ends of rear side frames (not shown) on left and right sides of the vehicle body, and a hitch stay 12 (protruding portion) provided at a center of the rear back beam 11 in the vehicle width direction.

The hitch stay 12 protrudes rearward from the rear bumper 5 through a notch 5a (refer to FIG. 1) provided in the rear bumper 5. A ball joint 13 is provided at a rear end of the hitch stay 12. A towed object is connected to the hitch member 10 via a ball joint 13.

As shown in FIGS. 1 and 2, the tailgate 3 is flipped up and rotatably supported by an opening edge on an upper end side of the opening 2a in the vehicle main body portion 2. The tailgate 3 automatically opens or closes the opening 2a with a driving force of an actuator (not shown). However, the tailgate 3 may also be configured to automatically perform only one of an opening operation and a closing operation. The tailgate 3 may be configured to perform an opening operation using an urging force of a gas damper (not shown) when a lock mechanism (not shown) that maintains a closed state is released.

In the present embodiment, the rear bumper 5 constitutes an attached member on the vehicle body side. An upper sensor electrode 110a (a sensor electrode) and a lower sensor electrode 111a (a sensor electrode) are attached to an inside of the rear bumper 5 via a sensor bracket 21 (refer to FIGS. 3 to 7). In the present embodiment, the upper sensor electrode 110a, the lower sensor electrode 111a, and the sensor bracket 21 constitute a main part of the motion detection device 20.

<Motion Detection Device 20>

As shown in FIGS. 3 and 4, the motion detection device 20 includes a sensor module 22 (refer to FIG. 4) including the upper sensor electrode 110a and the lower sensor electrode 111a described above, a controller 23 (refer to FIG. 3)

that receives a detection signal from the sensor module 22 and processes the signal, and the sensor bracket 21 that supports the sensor module 22 and the controller 23 and is attached to the inside of the rear bumper 5 in that state.

Figure 5:
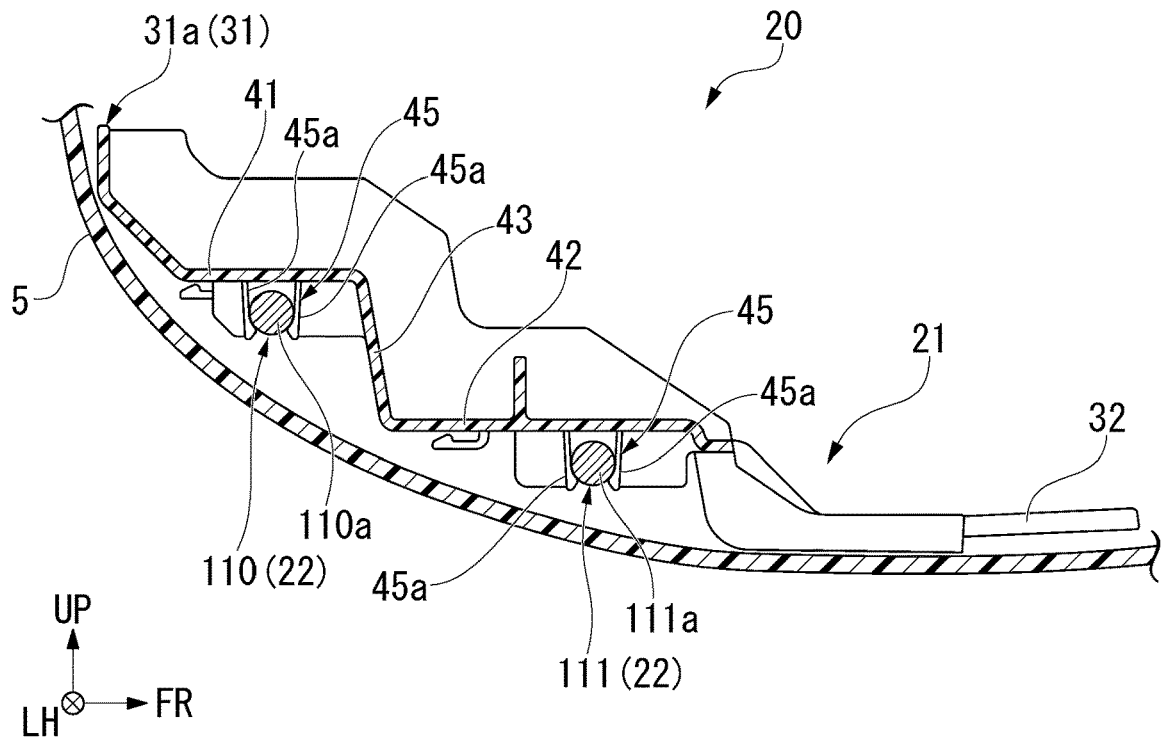
FIG. 5 is a cross-sectional view along line V-V of FIG. 4.
Figure 6:
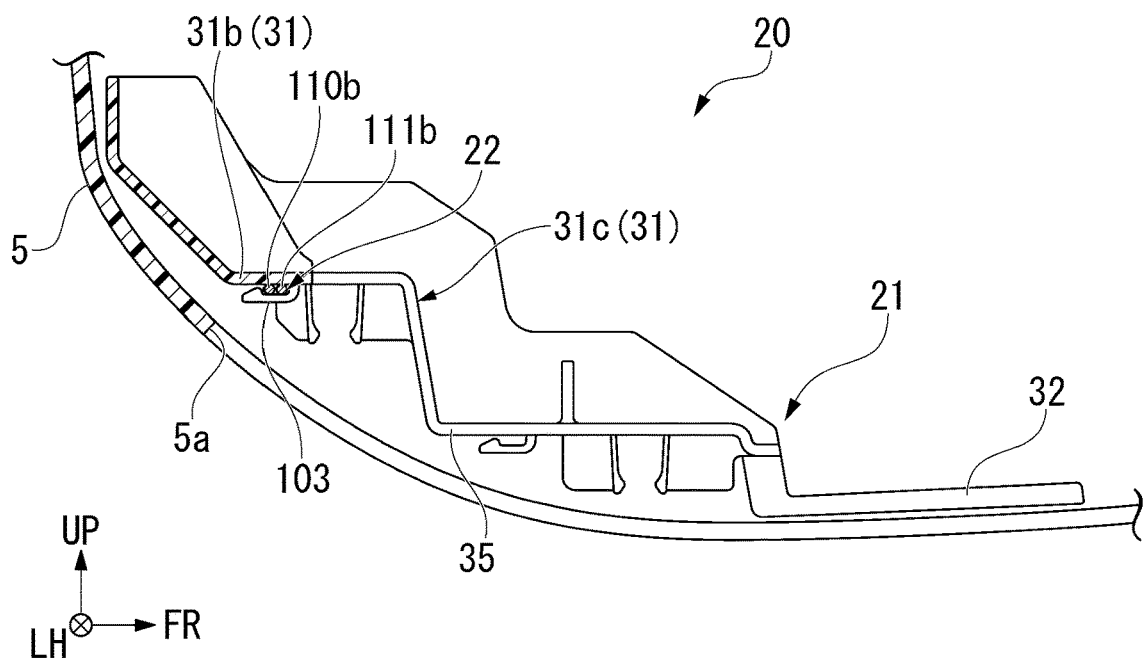
FIG. 6 is a cross-sectional view along line VI-VI of FIG. 4.
Figure 7:
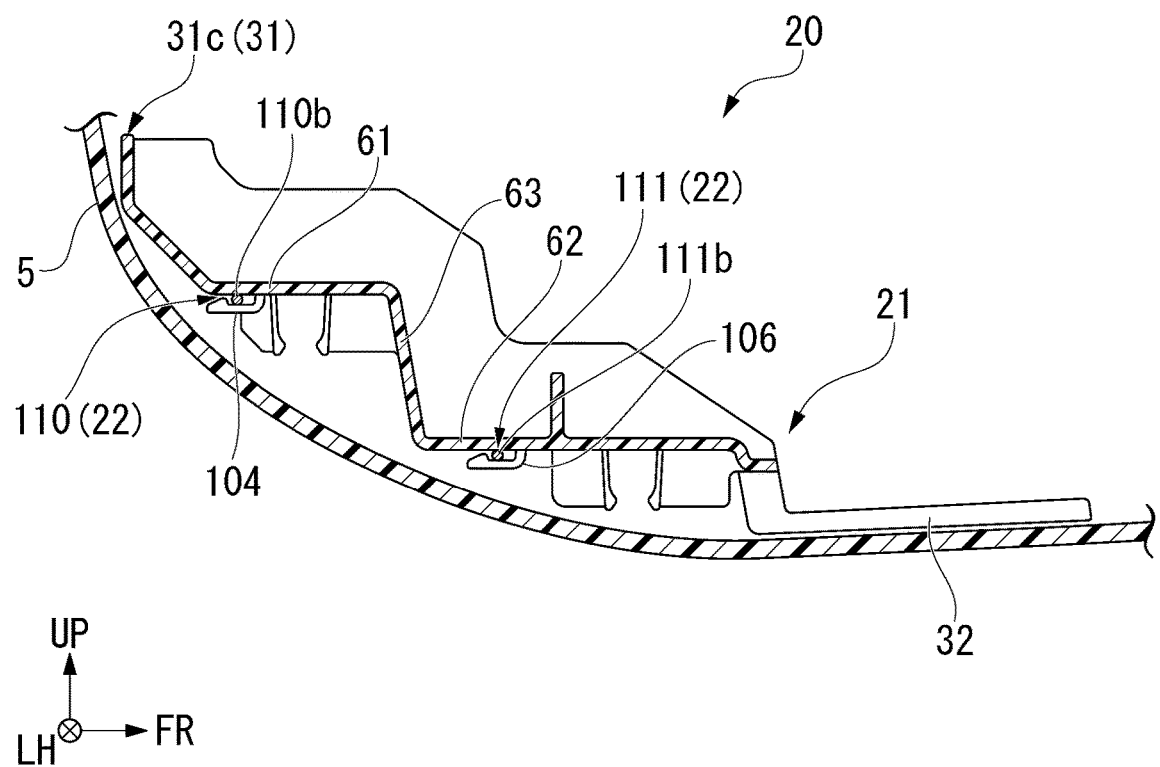
FIG. 7 is a cross-sectional view along line VII-VII of FIG. 4.

FIG. 5 is a cross-sectional view along line V-V of FIG. 4, and FIG. 6 is a cross-sectional view along line VI-VI of FIG. 4. FIG. 7 is a cross-sectional view along line VII-VII of FIG. 4.

The sensor bracket 21 is integrally formed of a resin material or the like. The sensor bracket 21 includes a bracket main body 31 and a plurality of attaching pieces 32. The bracket main body 31 extends in the vehicle width direction along an inner surface of the rear bumper 5. The bracket main body 31 holds the sensor module 22 on a lower surface side and holds the controller 23 on an upper surface side.

As shown in FIG. 3, an escape hole 35 is formed at a substantially central portion of the bracket main body 31 in the vehicle width direction. The escape hole 35 is cut out to leave the bridging portion 31b on an upper end side of the rear portion at substantially the center of the bracket main body 31 in the vehicle width direction. The escape hole 35 opens downward. The hitch stay 12 of the hitch member 10 penetrates the escape hole 35 in a front-rear direction. The bracket main body 31 straddles the hitch stay 12 extending in the front-rear direction using the bridging portion 31b at an upper part of the escape hole 35, and extends on both sides in the vehicle width direction with the escape hole 35 interposed therebetween.

The bracket main body 31 includes a sensor attaching portion 31a, a bridging portion 31b, a wiring attaching portion 31c, and a controller attaching portion 31d.

The sensor attaching portion 31a is a portion of the bracket main body 31 that is positioned on a right side (one side in the vehicle width direction) with respect to the escape hole 35. The sensor attaching portion 31a is formed in a staircase shape in which the front side is a low position in a side view from the vehicle width direction. Specifically, the sensor attaching portion 31a includes an upper sensor holding portion 41, a lower sensor holding portion 42, and a connection portion 43.

As shown in FIGS. 4 and 5, the upper sensor holding portion 41 extends in the front-rear direction and the vehicle width direction with a vertical direction as a thickness direction. As shown in FIG. 4, electrode holding claws 45 for holding the upper sensor electrode 110a and an engagement portion 46U serving as a positioning portion for the upper sensor electrode 110a are provided to protrude from a lower surface side of the upper sensor holding portion 41.

The electrode holding claw 45 is constituted by a pair of engagement pieces 45a facing each other in the front-rear direction. Each of the engagement pieces 45a extends downward from the upper sensor holding portion 41 in a cantilever method. Each of the engagement pieces 45a is configured to be elastically deformable in the front-rear direction. In the shown example, a plurality of electrode holding claws 45 are provided at intervals in the vehicle width direction.

In the present embodiment, the electrode holding claws 45 constitute a holding portion that holds a sensor electrode (the upper sensor electrode 110a) in a direction intersecting an extending direction of the sensor electrode.

The engagement portion 46U is arranged between the electrode holding claw 45 positioned on the leftmost side and the electrode holding claw 45 positioned on a right side of the electrode holding claws 45 positioned on the leftmost side in the upper sensor holding portion 41. The engagement portion 46U is constituted by a pair of ribs 50U provided to protrude from the lower surface of the upper sensor holding portion 41. Each rib 50U extends to be orthogonal to the vehicle width direction. The pair of ribs 50U are provided to protrude at a predetermined interval in the vehicle width direction. A substantially U-shaped groove 51 that opens downward is formed in each rib 50U. A detailed shape of the engagement portion 46U and setting of each portion will be described in detail below.

The connection portion 43 extends downward from a front end of the upper sensor holding portion 41. In the shown example, the connection portion 43 is inclined diagonally forward and downward. However, an inclination angle of the connection portion 43 with respect to a horizontal direction can be appropriately changed.

The lower sensor holding portion 42 extends forward from a lower end of the connection portion 43. Therefore, the lower sensor holding portion 42 is arranged in front of and below the upper sensor holding portion 41 and blocked from the upper sensor holding portion 41 by the connection portion 43 in the front-rear direction.

The lower sensor holding portion 42 is provided with an engagement portion 46L and the electrode holding claws 45 in the same manner as the upper sensor holding portion 41. The plurality of electrode holding claws 45 are provided on a lower surface of the lower sensor holding portion 42 at intervals in the vehicle width direction. A structure of each electrode holding claw 45 is the same as that provided in the upper sensor holding portion 41.

The electrode holding claws 45 of the lower sensor holding portion 42 constitute a holding portion that holds a sensor electrode (the lower sensor electrode 111a) in a direction intersecting an extending direction of the sensor electrode.

The engagement portion 46L is arranged between the electrode holding claw 45 positioned on the leftmost side and the electrode holding claw 45 positioned on a right side of the electrode holding claws 45 positioned on the leftmost side in the lower sensor holding portion 42. The engagement portion 46L is constituted by a pair of ribs 50L provided to protrude from the lower surface of the lower sensor holding portion 42. Each rib 50L extends to be orthogonal to the vehicle width direction in the same manner as that provided in the upper sensor holding portion 41. The pair of ribs 50L are provided to protrude at a predetermined interval in the vehicle width direction. In each rib 50L, the substantially U-shaped groove 51 that opens downward in the same manner as that provided in the upper sensor holding portion 41 is formed. A detailed shape of the engagement portion 46L and the setting of each part will be described in detail below.

As shown in FIG. 4, a first wiring holding claw 101 in the shape of an L-shaped hook is provided at a portion positioned on a left side of the electrode holding claw 45 arranged on the leftmost side in the lower sensor holding portion 42. The first wiring holding claw 101 is provided to protrude from the lower surface of the lower sensor holding portion 42. The first wiring holding claw 101 holds the lower wiring 111b of the sensor module 22, which will be described below, on the lower surface of the lower sensor holding portion 42 and guides the lower wiring 111b along the lower surface of the lower sensor holding portion 42 in the front-rear direction.

As shown in FIGS. 4 and 6, the bridging portion 31b extends to a left side from the upper sensor holding portion 41. The bridging portion 31b is a portion constituting a rear end edge of the escape hole 35. The bridging portion 31b has a shorter dimension in the front-rear direction than the sensor attaching portion 31a and the wiring attaching portion 31c. A second wiring holding claw 102 in the shape of an L-shaped hook is provided to protrude from a lower surface of the bridging portion 31b. The second wiring holding claw 102 holds the upper wiring 110b and the lower wiring 111b of the sensor module 22, which will be described below, together on the lower surface of the bridging portion 31b, and guides the upper wiring 110b and the lower wiring 111b in the vehicle width direction on a lower surface side of the bridging portion 31b.

As shown in FIGS. 4 and 7, the wiring attaching portion 31c is a portion of the bracket main body 31 positioned on a left side (the other side in the vehicle width direction) of the escape hole 35. The wiring attaching portion 31c is connected to the sensor attaching portion 31a via the bridging portion 31b. Similarly to the sensor attaching portion 31a, a side view shape of the wiring attaching portion 31c is formed in a staircase shape in which the front side is lower. Specifically, the wiring attaching portion 31c includes an upper wiring holding portion 61, a lower wiring holding portion 62, and a connection portion 63.

The upper wiring holding portion 61 extends in the vehicle width direction at a height equivalent to that of the upper sensor holding portion 41. As shown in FIG. 4, the upper wiring holding portion 61 is provided with a third wiring holding claw 103 and a fourth wiring holding claw 104.

The third wiring holding claw 103 is provided at a position equivalent to that of the bridging portion 31b in the front-rear direction in a right end portion of the upper wiring holding portion 61. The third wiring holding claw 103 is provided to protrude from a lower surface of the upper wiring holding portion 61 in the shape of an L-shaped hook.

The fourth wiring holding claw 104 is provided on a left side of the third wiring holding claw 103 in the upper wiring holding portion 61. The fourth wiring holding claw 104 is provided to protrude from the lower surface of the upper wiring holding portion 61 in the shape of an L-shaped hook. A plurality of fourth wiring holding claws 104 are provided in the upper wiring holding portion 61 at intervals in the vehicle width direction.

The connection portion 63 extends downward from a front end of the upper wiring holding portion 61. The connection portion 63 overlaps with the connection portion 43 of the upper sensor holding portion 41 in a side view.

The lower wiring holding portion 62 extends forward from a lower end of the connection portion 63. The lower wiring holding portion 62 overlaps with the lower sensor holding portion 42 in a side view. The lower wiring holding portion 62 is provided with a fifth wiring holding claw 105 and a sixth wiring holding claw 106.

The fifth wiring holding claw 105 is provided at a portion positioned on a left side of the third wiring holding claw 103 in a right end portion of the lower wiring holding portion 62. The fifth wiring holding claw 105 protrudes in the shape of an L-shaped hook from a lower surface of the lower wiring holding portion 62. The fifth wiring holding claw 105 protrudes downward from the lower surface of the lower wiring holding portion 62, and then extends diagonally forward to the right in an L shape.

The sixth wiring holding claw 106 is provided on a left side of the fifth wiring holding claw 105 in the lower wiring holding portion 62. The sixth wiring holding claw 106 is provided to protrude from the lower surface of the lower wiring holding portion 62 in the shape of an L-shaped hook. A plurality of sixth wiring holding claws 106 are provided in the lower wiring holding portion 62 at intervals in the vehicle width direction.

The controller attaching portion 31d constitutes a left end portion of the bracket main body 31. A dimension of the controller attaching portion 31d in the front-rear direction is set to be equivalent to that of the sensor attaching portion 31a or the wiring attaching portion 31c. The controller attaching portion 31d extends in the vehicle width direction at a height equivalent to that of the upper wiring holding portion 61. The controller attaching portion 31d is provided with a seventh wiring holding claw 107 and an eighth wiring holding claw 108.

The seventh wiring holding claw 107 is provided in a position near the rear portion of the controller attaching portion 31d, and the eighth wiring holding claw 108 is provided in a position near the front portion of the controller attaching portion 31d. The seventh wiring holding claw 107 and the eighth wiring holding claw 108 are provided to protrude from the lower surface of the controller attaching portion 31d in the shape of an L-shaped hook.

An arrangement hole 109 is formed at the left end portion of the controller attaching portion 31d. The arrangement hole 109 penetrates the controller attaching portion 31d in the vertical direction and is open on a left edge of the controller attaching portion 31d.

The attaching piece 32 extends forward from a front edge of the bracket main body 31. A plurality of attaching pieces 32 are provided at intervals in the vehicle width direction. The sensor bracket 21 is attached to the inner surface of the rear bumper 5 via the attaching piece 32 or the like. As a result, the motion detection device 20 is arranged inside the rear bumper 5.

<Sensor Module 22>

The sensor module 22 includes an upper sensor unit 110 and a lower sensor unit 111.

The upper sensor unit 110 includes an upper sensor electrode 110a and an upper wiring 110b. The lower sensor unit 111 includes a lower sensor electrode 111a and a lower wiring 111b.

The upper sensor electrode 110a and the lower sensor electrode 111a are sensors that detect static capacitance that changes according to an approach of an object. The upper sensor electrode 110a and the lower sensor electrode 111a include rod-shaped electrode main bodies 120 and 130, protective caps 121 and 131 (protective caps) that are adhered to an outer circumference of one end side (a side connected to the upper wiring 110b or the lower wiring 111b) of the electrode main bodies 120 and 130 in a longitudinal direction, and an end cap 52 that is adhered to the outer circumference of the other end side of the electrode main bodies 120 and 130 in the longitudinal direction.

The electrodes main bodies 120 and 130 are formed by, for example, a core formed of a resin material or the like being collectively covered with the outer skin while it is wrapped in a mesh formed of a conductive material. The electrodes main bodies 120 and 130 are formed in a shape of a cylindrical rod as a whole. The protective caps 121 and 131 and the end cap 52 are formed of, for example, a non-conductive resin material.

The upper sensor electrode 110a is held on the lower surface side of the upper sensor holding portion 41 by holding parts of the electrode main body 120 and the protective cap 121 between a plurality of electrode holding claws 45. Similarly, the lower sensor electrode 111a is held on the lower surface side of the lower sensor holding portion 42 by holding parts of the electrode main body 130 and the protective cap 131 between a plurality of electrode holding claws 45. At this time, the respective protective caps 121 and 131 of the upper sensor electrode 110a and the lower sensor electrode 111a are engaged with the engagement portions 46U and 46L provided to protrude from each lower surfaces of the upper sensor holding portion 41 and the lower sensor holding portion 42. A specific engagement form of the engagement portions 46U and 46L will be described in detail below.

The upper sensor electrode 110a and the lower sensor electrode 111a held by the upper sensor holding portion 41 and the lower sensor holding portion 42 as described above are arranged on a lower surface of the bracket main body 31 while they are spaced apart from each other in the front-rear direction and in the vertical direction.

One end portion (an end portion on the right side in FIG. 4) of the upper wiring 110b is connected to the electrode main body 120 of the upper sensor electrode 110a, and the other end portion (an end portion on the left side in FIG. 4) is connected to the controller 23. Similarly, one end portion (an end portion on the right side in FIG. 4) of the lower wiring 111b is connected to the electrode main body 130 of the lower sensor electrode 111a, and the other end portion (an end portion on the left side in FIG. 4) is connected to the controller 23. The upper wiring 110b and the lower wiring 111b have a configuration in which a wire rod formed of a conductive material is covered with an outer skin. A connection portion between the upper wiring 110b and the electrode main body 120 of the upper sensor electrode 110a is covered by the protective cap 121. Similarly, a connection portion between the lower wiring 111b and the electrode main body 130 of the lower sensor electrode 111a is covered by the protective cap 131.

The upper wiring 110b and the lower wiring 111b are drawn around in the vehicle width direction on the lower surface side of the bridging portion 31b while they are held by the second wiring holding claw 102. The upper wiring 110b is drawn around in a direction of the controller attaching portion 31d on a lower surface side of the upper wiring holding portion 61 while it is held by the third wiring holding claw 103 and the fourth wiring holding claw 104. The upper wiring 110b drawn around to the controller attaching portion 31d is held by the seventh wiring holding claw 107 on the lower surface side of the controller attaching portion 31d. The lower wiring 111b is drawn around in the direction of the controller attaching portion 31d on the lower surface side of the lower wiring holding portion 62 while it is held by the fifth wiring holding claw 105 and the sixth wiring holding claw 106. The lower wiring 111b drawn around to the controller attaching portion 31d is held by the eighth wiring holding claw 108 on the lower surface side of the controller attaching portion 31d.

As described above, the upper wiring 110b and the lower wiring 111b held by the wiring attaching portion 31c are drawn around while they are separated from each other in the vertical direction and the front-rear direction.

As shown in FIG. 3, the upper wiring 110b and the lower wiring 111b are drawn around to an upper surface side of the sensor bracket 21 through the arrangement hole 109. The end portions of the upper wiring 110b and the lower wiring 111b are put together by a coupler 132 on the upper surface side of the sensor bracket 21.

The controller 23 is attached to an upper surface side of the sensor attaching portion 31a. A sensor module 22 is connected to the controller 23 via a coupler 132. The controller 23 detects a change in static capacitance based on results of the detection by the upper sensor electrode 110a and the lower sensor electrode 111a. The controller 23 determines whether a kicking motion has been performed based on the detected change in static capacitance. That is, the controller 23 determines whether the change in static capacitance, detected by the upper sensor electrode 110a and the lower sensor electrode 111a, is due to the kicking motion or noise. When the controller 23 determines that the change in static capacitance is due to the kicking motion, the controller 23 outputs an operation signal toward an actuator of the tailgate 3. The controller 23 may be attached to a lower surface side of the sensor bracket 21.

<Engagement Form of Sensor Electrode>

Next, an engagement form of the upper sensor electrode 110a and the lower sensor electrode 111a by the engagement portions 46U and 46L of the bracket main body 31 will be described in detail.

Figure 8:
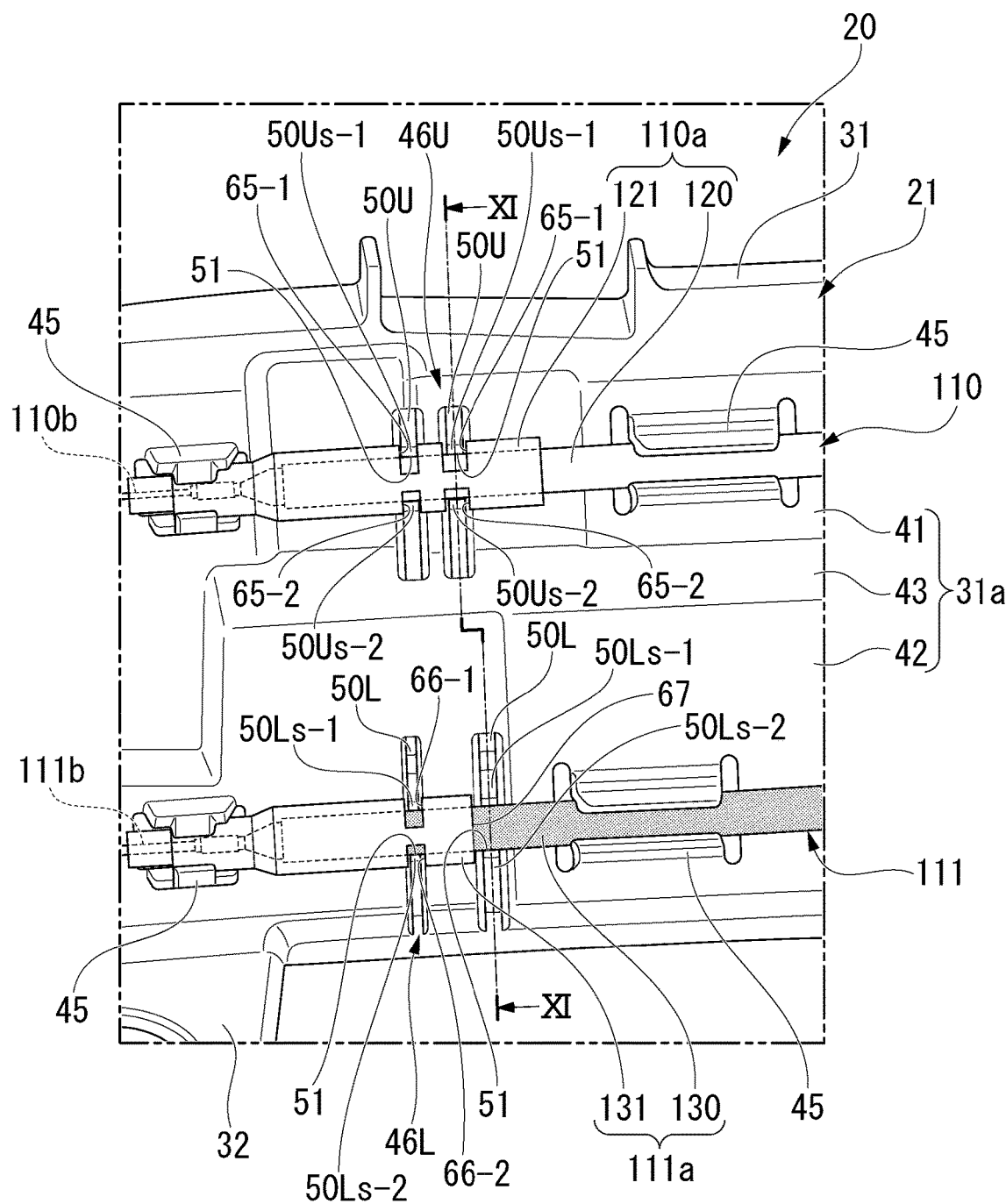
FIG. 8 is a front view of an VIII portion of FIG. 4.
Figure 9:
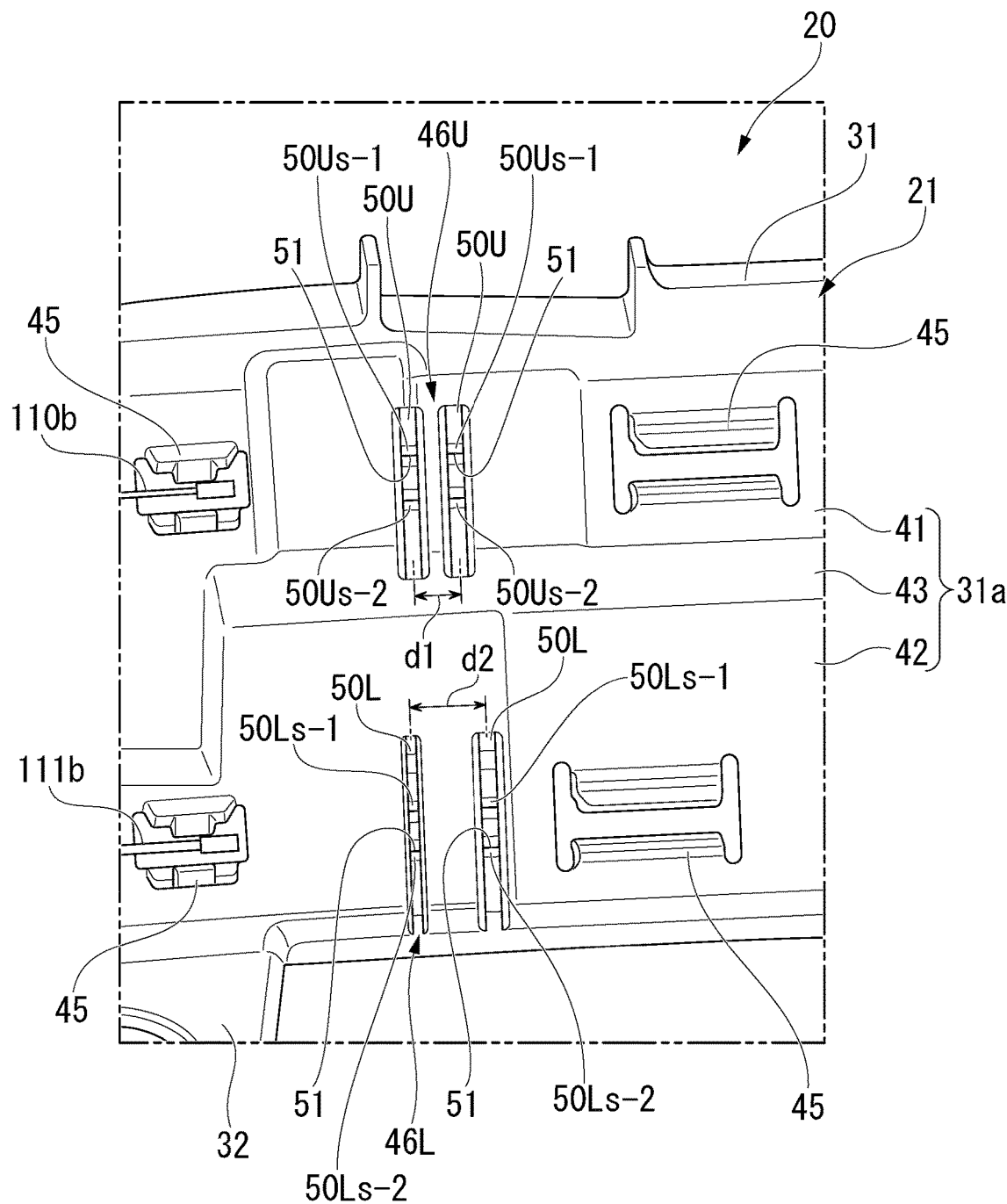
FIG. 9 is a front view of the VIII portion of FIG. 4 from which a sensor electrode is removed.
Figure 10:
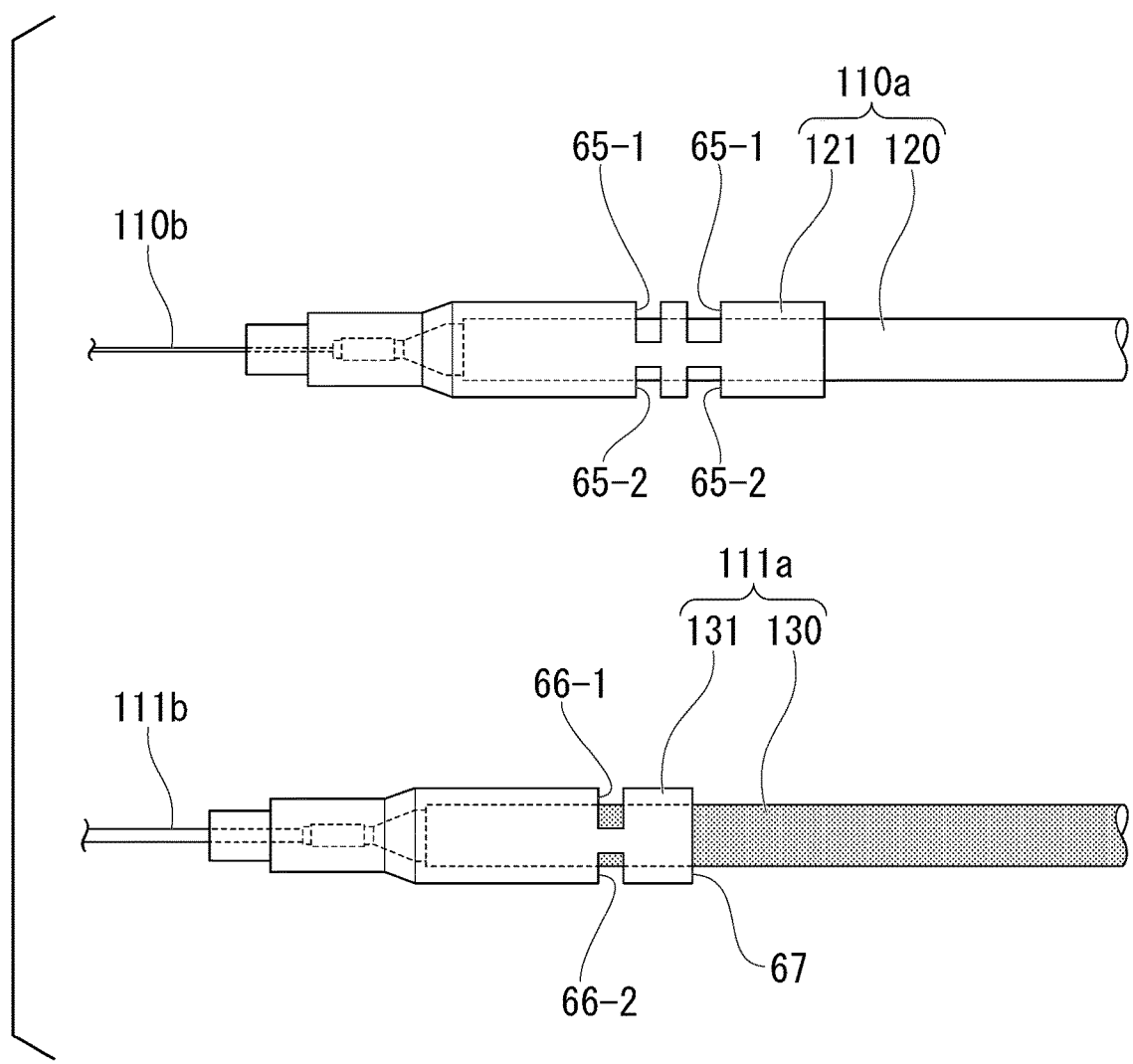
FIG. 10 is a front view of two sensor electrodes of the motion detection device of the embodiment.
Figure 11:
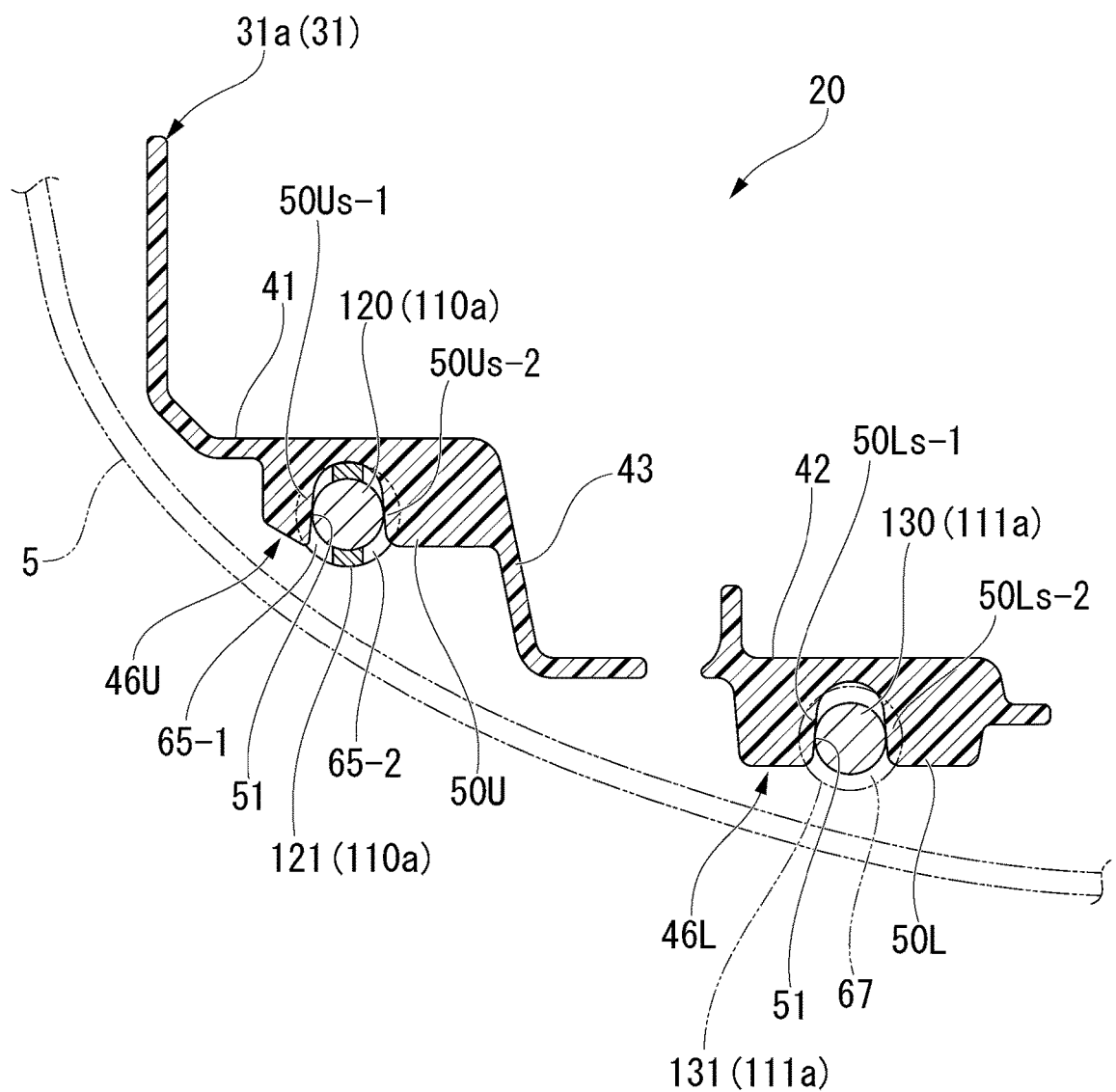
FIG. 11 is a cross-sectional view along line XI-XI of FIG. 8.

FIG. 8 is a front view of the VIII portion of FIG. 4, and FIG. 9 is a front view of the VII portion of FIG. 4 from which the upper sensor electrode 110a and the lower sensor electrode 111a are removed. FIG. 10 is a front view of the upper sensor electrode 110a and the lower sensor electrode 111a, and FIG. 11 is a cross-sectional view along line XI-XI of FIG. 8.

As shown in FIG. 9, the engagement portion 46U of the upper sensor holding portion 41 has a pair of ribs 50U provided to protrude with a predetermined separation width d1 in the vehicle width direction. Side edges of substantially U-shaped grooves 51 formed in each rib 50U, which are facing each other, constitute protruding pieces 50Us-1 and 50Us-2 engaged with notch portions 65-1 and 65-2 (engaged portions) on an outer circumference of the protective cap 121 to be described below. The protruding pieces 50Us-1 and 50Us-2 extend in a tangential direction of an outer circumferential surface of the upper sensor electrode 110a in the front-rear direction so as to sandwich the outer circumferential surface.

In the present embodiment, the pair of protruding pieces 50Us-1 and 50Us-2 of each rib 50U constitute a protruding portion engaged with the notch portions 65-1 and 65-2 on the upper sensor electrode 110a (the protective cap 121) side. Two pairs of protruding pieces 50Us-1 and 50Us-2 formed on two adjacent ribs 50U are arranged with the predetermined separation width d1 in the vehicle width direction.

As shown in FIG. 10, the upper sensor electrode 110a has the pair of notch portions 65-1 and 65-2 formed in a width across flat shape at positions corresponding to the protruding pieces 50Us-1 and 50Us-2 of each rib 50U on an outer circumferential surface of the protective cap 121. Specifically, the notch portions 65-1 and 65-2 are constituted by grooves having a constant width, extending in the vertical direction, on a front surface side and a rear surface side of the outer circumferential surface of the protective cap 121. A width of each of the notch portions 65-1 and 65-2 (grooves) in the vehicle width direction is set to a width substantially the same as a thickness (a thickness in the vehicle width direction) of a corresponding protruding piece 50Us-1 or 50Us-2. For this reason, when the corresponding protruding pieces 50Us-1 and 50Us-2 are engaged with each of the notch portions 65-1 and 65-2, the upper sensor electrode 110a is positioned with respect to the sensor bracket 21 in the vehicle width direction.

A separation width in the vehicle width direction of the pair of two notch portions 65-1 and 65-2 formed on the outer circumferential surface of the protective cap 121 is set to be the same as the separation width d1 between adjacent ribs 50U. For this reason, the protruding pieces 50Us-1 and 50Us-2 on two adjacent ribs 50U can be engaged with the corresponding notch portions 65-1 and 65-2 on the protective cap 121 at the same time, respectively.

Each of the notch portions 65-1 and 65-2 is formed so that a part of the outer circumferential surface of the inner electrode main body 120 is exposed from the protective cap 121. However, when a wall thickness of the protective cap 121 is sufficiently thick, the notch portions 65-1 and 65-2 may be formed at a depth at which the electrode main body 120 is not exposed.

As shown in FIG. 9, the engagement portion 46L of the lower sensor holding portion 42 has a pair of ribs 50L provided to protrude with a predetermined separation width d2 in the vehicle width direction. This separation width d2 is set to be larger than the separation width d1 of the pair of ribs 50U on the upper sensor holding portion 41 side.

Side edges of the substantially U-shaped groove 51 formed in one of the ribs 50L (a rib 50L on the left side in FIGS. 8 and 9), which face each other, constitute protruding pieces 50Ls-1 and 50Ls-2 engaged with notch portions 66-1 and 66-2 (engaged portions) on the outer circumference of the protective cap 131 to be described below. Side edges of the substantially U-shaped groove 51 formed in the other rib 50L (a rib 50L on the right side in FIGS. 8 and 9), which face each other, constitute the protruding pieces 50Ls-1 and 50Ls-2 that are in contact with (engaged with) an end surface 67 (an end surface of a notch portion) of the protective cap 131 to be described below. The protruding pieces 50Ls-1, 50Ls-2 of both ribs 50L extend in the tangential direction of an outer circumferential surface of the lower sensor electrode 111a in the front-rear direction so as to sandwich the outer circumferential surface.

Each of the protruding pieces 50Ls-1 and 50Ls-2 constitutes a protruding portion engaged with a corresponding notch portion on the lower sensor electrode 111a (the protective cap 131) side. Two pairs of protruding pieces 50Ls-1 and 50Ls-2 formed on two adjacent ribs 50L are arranged with the predetermined separation width d2 in the vehicle width direction.

As shown in FIG. 10, the lower sensor electrode 111a has a pair of notch portions 66-1 and 66-2 formed in a width across flat shape at positions corresponding to the protruding pieces 50Ls-1 and 50Ls-2 of one rib 50L (a rib 501, on the left side in FIGS. 8 and 9) on an outer circumferential surface of the protective cap 131. The notch portions 66-1 and 66-2 are constituted by grooves having a constant width, which extend in the vertical direction on the front surface side and the rear surface side of the outer circumferential surface of the protective cap 131. A width of each of the notch portions 66-1 and 66-2 (grooves) in the vehicle width direction is set to a width substantially the same as a thickness of the corresponding protruding piece 50Ls-1 or 50Ls-2 (a thickness in the vehicle width direction). For this reason, when the corresponding protruding pieces 50Ls-1 and 50Ls-2 are engaged with the notch portions 66-1 and 66-2, the lower sensor electrode 111a is positioned with respect to the sensor bracket 21 in the vehicle width direction.

A right end surface 67 of the protective cap 131 is constituted by a notch portion with which side surfaces of the right protruding pieces 50Ls-1 and 50Ls-2 of the engagement portion 46L are in contact. A separation width between the notch portions 66-1 and 66-2 and the end surface 67 on the protective cap 131 in the vehicle width direction is set to be the same as the separation width d2 between adjacent ribs 50L. For this reason, the protruding pieces 50Ls-1 and 50Ls-2 on two adjacent ribs 50L can be engaged with the notch portions 66-1 and 66-2 and the end surface 67 on the protective cap 131.

The notch portions 66-1 and 66-2 on the protective cap 131 are formed so that a part of an outer circumferential surface of the inner electrode main body 130 is exposed from the protective cap 131.

In the present embodiment, the separation width d1 of the two protruding pieces 50Us-1 and 50Us-2 on the upper sensor holding portion 41 side differs from the separation width d2 of the two protruding pieces 50Ls-1 and 50Ls-2 on the lower sensor holding portion 42 side. For this reason, when the protective caps 121 and 131 of the upper sensor electrode 110a and the lower sensor electrode 11a are assembled to appropriate engagement portions 46U and 46L, as shown in FIGS. 8 and 11, each of the protruding pieces 50Us-1, 50Us-2, 50Ls-1, and 50Ls-2 can be engaged with a corresponding notch portion. However, when they are assembled to inappropriate engagement portions 46U and 46L, the protruding pieces 50Us-1, 50Us-2, 50Ls-1, and 50Ls-2 cannot be engaged on sides of the protective caps 121 and 131.

The upper sensor electrode 110a and the lower sensor electrode 111a have different surface colors of the electrode main bodies 120 and 130. For this reason, when a sensor electrode is assembled, an operator can easily visually confirm whether the sensor electrode to be assembled is the upper sensor electrode 110a or the lower sensor electrode 111a. Instead of making the surface colors of the electrode main bodies 120 and 130 different, colors of the protective caps 121 and 131 may be made different. Overall colors of the upper sensor electrode 110a and the lower sensor electrode 111a may be made different. Furthermore, instead of making surface colors different, surface patterns may be made different.

Effect of Embodiment

In the motion detection device 20 of the present embodiment, the engagement portions 46U and 46L of the sensor bracket 21 and an engaged portion of each of the sensor electrodes 110a and 111a allow mutual engagement between regular combinations, and are formed in a shape that regulates mutual engagement other than the regular combination. For this reason, it is difficult to assemble the sensor electrodes 110a and 111a to the sensor bracket 21 in a position other than a regular assembling position, so that an assembling worker may quickly ascertain that the assembling position of the sensor electrodes 110a and 111a is inappropriate. Therefore, when the motion detection device 20 of the present embodiment is adopted, the plurality of sensor electrodes 110a and 111a can be assembled in appropriate positions on the sensor bracket 21 without any error.

The motion detection device 20 of the present embodiment is provided with the protruding pieces 50Us-1, 50Us-2, 50Ls-1, and 50Ls-2, which are protruding portions, on the sensor bracket 21 side, and is provided with the notch portions 65-1, 65-2, 66-1, and 66-2 and the end surface 67 (notch portion) that allow acceptance of the protruding pieces 50Us-1, 50Us-2, 50Ls-1, and 50Ls-2 on the sides of the protective caps 121 and 131 only when the assembling position is appropriate. For this reason, when this configuration is adopted, it is possible to easily prevent erroneous assembly of the sensor electrodes 110a and 111a without processing the electrode main bodies 120 and 130 of the sensor electrodes 110a and 111a.

In the motion detection device 20 of the present embodiment, the sensor bracket 21 is provided with electrode holding claws 45 (holding portions) that hold each of the sensor electrodes 110a and 111a in a direction intersecting an extending direction of a corresponding sensor electrode, and the protruding piece 50Us-1, 50Us-2, 50Ls-1, and 50Ls-2, the notch portions 65-1, 65-2, 66-1, and 66-2, and the end surface 67 (a notch portion) are engaged to regulate displacement of the sensor electrodes 110a and 111a in the extending direction. For this reason, it is possible to obtain a basic effect that the erroneous assembly of the sensor electrodes 110a and 111a can be prevented, and it is possible to prevent misalignment of the sensor electrodes 110a and 111a in a direction parallel to the extending direction when they are appropriately assembled.

Furthermore, in the motion detection device 20 of the present embodiment, paired protruding pieces 50Us-1 and 50Us-2, and 50Ls-1 and 50Ls-2 of the engagement portions 46U and 46L extend in a substantially tangential direction of the outer circumferential surfaces of the sensor electrodes 110a and 111a so as to sandwich the outer circumferential surfaces. For this reason, when the sensor electrodes 110a and 111a are assembled in a regular assembling position, facing positions of the sensor electrodes 110a and 111a on the outer circumferential side are sandwiched by the paired protruding pieces 50Us-1 and 50Us-2, and 50Ls-1 and 50Ls-2, and the respective protruding pieces 50Us-1, 50Us-2, 50Ls-1, and 50Ls-2 are stably engaged with the corresponding notch portions 65-1, 65-2, 66-1, and 66-2, and the end surface 67 (the notch portion) in that state. On the other hand, when the sensor electrodes 110a and 111a are assembled in a position other than the regular assembling position, the assembly of the sensor electrodes 110a and 111a is reliably regulated by the paired protruding pieces 50Us-1 and 50Us-2, and 50Ls-1 and 50Ls-2. Therefore, when this configuration is adopted, it is possible to more reliably prevent the erroneous assembly of the sensor electrodes 110a and 111a.

In the motion detection device 20 of the present embodiment, separation widths of the paired protruding pieces 50Us-1 and 50Us-2, and 50Ls-1 and 50Ls-2 corresponding to the notch portions 65-1, 65-2, 66-1, and 66-2 and the end surface 67 (notch portion) of the sensor electrodes 110a and 111a are different for each corresponding sensor electrode. For this reason, in a position other than the regular assembling position, it is not possible to cause the paired protruding pieces 50Us-1 and 50Us-2, and 50Ls-1 and 50Ls-2 to be accepted by the notch portions 65-1, 65-2, 66-1, and 66-2 and the end surface 67 (notch portion) on the sensor bracket 21 side at the same time. Therefore, when this configuration is adopted, it is possible to more reliably prevent the erroneous assembly of the sensor electrodes 110a and 111a.

In the motion detection device 20 of the present embodiment, at least one of the surface colors and patterns of the sensor electrodes 110a and 111a is different from each other. For this reason, when the sensor electrodes 110a and 111a are assembled to the sensor bracket 21, an error in assembling the sensor electrodes 110a and 111a can be found by visual confirmation by the assembling worker.

Other Embodiment

Figure 12:
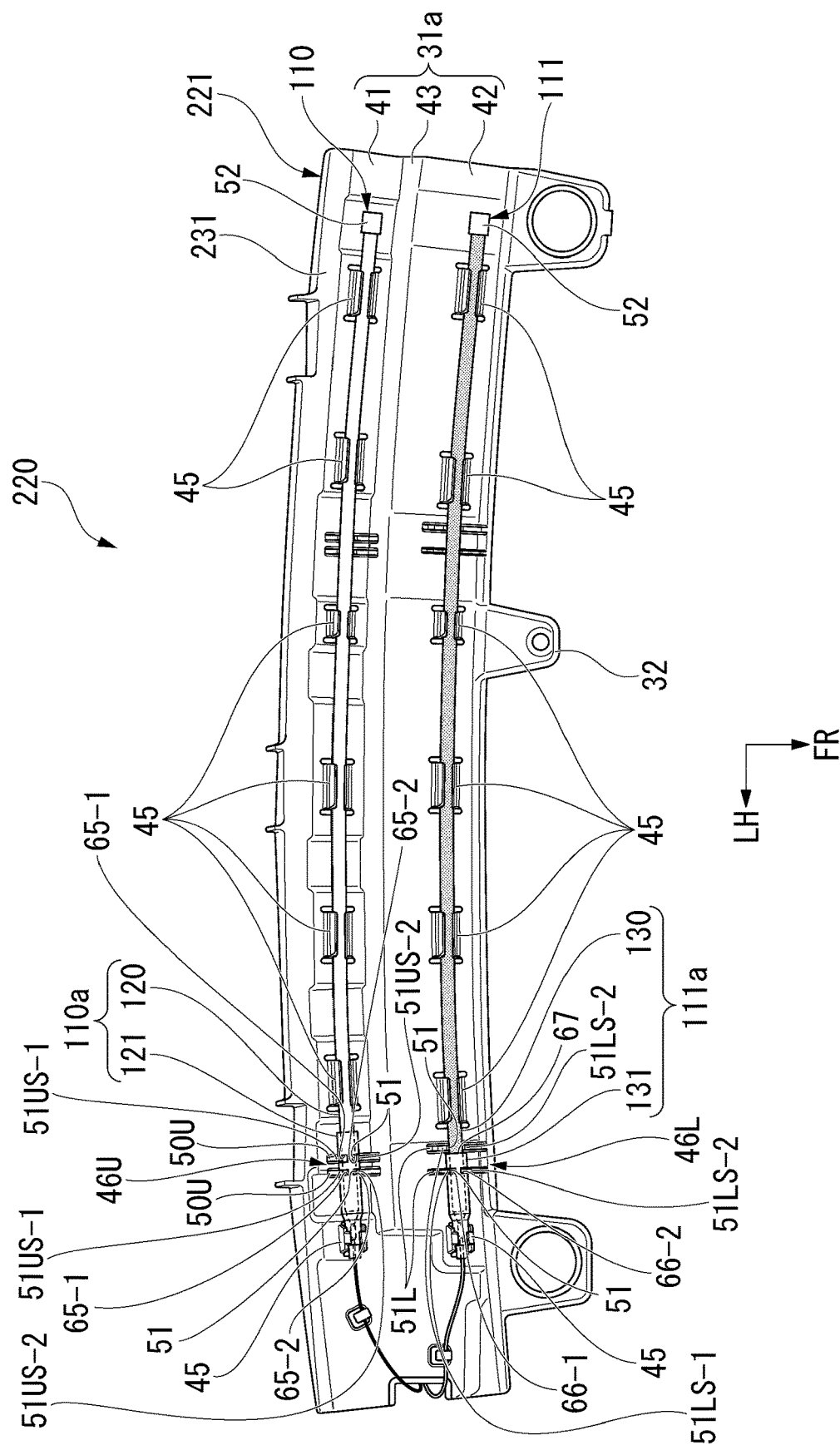
FIG. 12 is a view of a motion detection device of another embodiment from below.

FIG. 12 is a view of a motion detection device 220 of another embodiment from below. In FIG. 12, the same portion as that of the embodiment described above will be denoted by a common reference numeral.

The motion detection device 220 of the present embodiment has almost the same basic configuration as the embodiment described above, but a shape of a sensor bracket 221 is different from that of the embodiment described above.

The sensor bracket 221 of the present embodiment is used for a vehicle that does not have the hitch stay 12. For this reason, the sensor bracket 221 does not have an escape hole 35, the upper sensor holding portion 41 and the lower sensor holding portion 42 extend continuously in the vehicle width direction, and the upper sensor electrode 110a and the lower sensor electrode 111a extend long in the vehicle width direction. The engagement portions 46U and 46L engaged with the upper sensor electrode 110a and the lower sensor electrode 111a are arranged on one end side of the sensor bracket 221 in the longitudinal direction.

Even in the case of the present embodiment, the engagement form of the sensor electrodes 110a and 111a is the same as that of the embodiment described above. For this reason, even in the case of the present embodiment, the same basic effect as that of the embodiment described above can be obtained.

The present invention is not limited to the embodiment described above, and various design changes can be made within a range not departing from the gist thereof.

For example, in the embodiment described above, the notch portion is formed on the sensor electrode side and the protruding portion is provided on the sensor bracket side, but, on the contrary, the notch portion may be formed on the sensor bracket side and the protruding portion may be provided on the sensor electrode side. The number of notch portions and protruding portions provided in the sensor electrode and the sensor bracket is not limited to that in the embodiment described above, and may be three or more. Instead of changing a separation width of the notch portion and the protruding portion, a shape and a size of a fitting portion of the notch portion and the protruding portion may also be changed.

In the embodiment described above, the sensor electrode is attached to the rear bumper which is an attached member via the sensor bracket, and an attaching part (an attached member) of the sensor electrode is not limited to the rear bumper, but may be a front bumper, a side sill, or the like. A use of the motion detection device is also not limited to opening and closing the tailgate, and the motion detection device may be used for other uses as long as it is used to operate a device around a vehicle in a non-contact manner.

What is claimed is:

1. A motion detection device comprising:
  a plurality of sensor electrodes configured to detect static capacitance, each sensor electrode of the plurality of sensor electrodes includes:
    a rod-shaped electrode main body,
    a protective cap that is adhered to an outer circumferential surface of a part of the electrode main body, and
    a notch portion formed in the protective cap; and
  a sensor bracket to which the plurality of sensor electrodes are attached, the sensor bracket provided with a plurality of engagement portions, including an engagement portion for each sensor electrode, the engagement portion provided as a protruding portion that is configured for acceptance by an engaged portion provided by the notch portion formed in the protective cap of each sensor electrode,
  wherein in an assembled configuration of the motion detection device, each engagement portion of the sensor bracket is engaged with an engaged portion by insertion of the protruding portion into the respective notch portion of each of the sensor electrodes, and the plurality of engagement portions of the sensor bracket and the engaged portion of each of the plurality of sensor electrodes are formed in a shape that allows an engagement between the engagement portion and the engaged portion when the engagement portion and the engaged portion are a regular combination and regulates the engagement between the engagement portion and the engaged portion when the engagement portion and the engaged portion are other than the regular combination.

2. The motion detection device according to claim 1, wherein the sensor bracket has a holding portion that holds each of the sensor electrodes in a direction intersecting an extending direction of a corresponding sensor electrode, and the protruding portion and the notch portion are engaged to regulate displacement of the sensor electrode with respect to the sensor bracket in a direction parallel to the extending direction.

3. The motion detection device according to claim 1, wherein the protruding portion has a pair of protruding pieces extending in a tangential direction of an outer circumferential surface of the sensor electrode with the outer circumferential surface therebetween.

4. The motion detection device according to claim 1, wherein the engaged portion is a notch portion formed in the sensor electrode, the engagement portion has a protruding portion accepted by the notch portion, a plurality of the protruding portions are arranged separated from each other in the extending direction of the sensor electrode, and a separation width of the plurality of protruding portions adjacent to each other in the extending direction is different for each corresponding sensor electrode.

5. The motion detection device according to claim 1, wherein each of the sensor electrodes has at least one of a surface color and a surface pattern, and the surface colors and the surface patterns are different from each other.

* * * * *